United States Patent [19]

Tani et al.

[11] Patent Number: 4,626,450
[45] Date of Patent: Dec. 2, 1986

[54] PROCESS FOR PRODUCING SEMICONDUCTOR DEVICES

[75] Inventors: Akihiko Tani, Tachikawa; Takashi Aoyagi, Musashino; Shuji Ikeda, Koganei; Kouichi Nagasawa, Kunitachi, all of Japan

[73] Assignee: Hitachi, Ltd., Tokyo, Japan

[21] Appl. No.: 748,195

[22] Filed: Jun. 24, 1985

[30] Foreign Application Priority Data

Jun. 25, 1984 [JP] Japan .................. 59-129323

[51] Int. Cl.⁴ .................. H01L 21/324
[52] U.S. Cl. .................. 427/93; 29/571; 148/1.5; 148/187
[58] Field of Search .................. 427/93; 29/571; 148/187, 1.5

[56] References Cited

U.S. PATENT DOCUMENTS

| | | | |
|---|---|---|---|
| 4,214,919 | 7/1980 | Young | 427/93 |
| 4,377,605 | 3/1983 | Yamamoto | 427/93 |
| 4,554,726 | 11/1985 | Hillenius | 29/571 |

FOREIGN PATENT DOCUMENTS 56-118366  9/1981  Japan .

OTHER PUBLICATIONS

Irene, "Method to Reduce Defects in Thw $SiO_2$ Films", IBM TDB, vol. 21, No. 1, Jun. 1978, pp. 393-394.

Primary Examiner—John D. Smith
Attorney, Agent, or Firm—Antonelli, Terry & Wands

[57] ABSTRACT

A process for producing semiconductor devices having excellent electric characteristics such as high threshold voltage Vth and small leakage current, maintaining high yields while preventing the occurrence of thermal etching at the time of heat-treatment to form a well diffusion layer in semiconductor devices such as CMOS IC's. Namely, a semiconductor wafer having a silicon dioxide film formed on the main surface thereof is heat-treated at a high temperature in an inert gas atmosphere. In this case, oxygen is contained in small amounts in the inert gas, so that pinholes formed in the silicon dioxide film are buried therein by the action of oxygen gas. Therefore, thermal etching is not generated by the high temperature inert gas, and the yields of semiconductor devices can be increased.

21 Claims, 14 Drawing Figures (A)

(B)

(A)

(B)

(C)

(D)

(E)

10μm

10μm

PROCESS FOR PRODUCING SEMICONDUCTOR DEVICES

BACKGROUND OF THE INVENTION

The present invention relates to a process for producing semiconductor devices. More specifically, the invention relates to a process for producing semiconductor devices while preventing thermal etching from taking place during the heat-treatment at high temperatures, enabling the yields of semiconductor devices to be increased.

In producing semiconductor devices, it is necessary to heat-treat the semiconductor wafers at high temperatures. For instance, when an impurity diffusion layer is to be formed on the main surface of a semiconductor wafer, it is accepted practice to dope the semiconductor wafer with impurities by ion implantation or the like, followed by heating at a high temperature, so that the impurities are diffused into the wafer. In a semiconductor device such as a complementary MOS (CMOS) IC containing CMOS transistors, in particular, it is essential to form a p-type or an n-type well diffusion layer in the semiconductor wafer to a depth of about 4 μm. Therefore, the step of diffusion must be carried out in an nitrogen gas atmosphere heated at 1200° C. for extended periods of time (see, for example, Japanese Patent Laid-Open No. 118366/1981).

SUMMARY OF THE INVENTION

The inventors have discovered the fact that when the impurities are diffused at a high temperature in a nitrogen gas atmosphere, there takes place a so-called thermal etching by which the surface of the semiconductor wafer is damaged by being etched by nitrogen at a high temperature despite the presence of a silicon dioxide ($SiO_2$) film on the surface of the semiconductor wafer. The reason is considered to be as described below. Namely, the silicon dioxide ($SiO_2$) film for preventing damage is formed having a thickness of about 200 to 300 angstroms at the greatest in keeping with the trend toward forming the element patterns very densely and finely and forming junctions shallowly. Therefore, high temperature nitrogen directly affects the main surface of the semiconductor wafer via film defects such as pinholes formed in the silicon dioxide ($SiO_2$) film, whereby thermal etching takes place to damage the main surface of the semiconductor wafer. Thermal etching occurs so frequently as to seriously decrease the yields of semiconductor devices and often to destructively decrease the yields thereof.

Thermal etching develops conspicuously not only in the above-mentioned treatment but also in heat-treatment effected at high temperatures in an atmosphere of inert gas such as nitrogen, argon, helium or the like.

Thermal etching results in the formation of defects of various shapes on the surface of the semiconductor wafer, such as the cross defect shown in FIG. 4 or the circular defect shown in FIG. 5. The defects widely vary in size. As shown in FIGS. 4 and 5, however, cross defects appear most frequently having a size of 30 to 40 μm, and circular defects appear most frequently having a diameter of 30 to 40 μm. The semiconductor elements that are formed on the semiconductor wafer on which cross defects or thermal defects are formed due to thermal etching exhibit poor characteristics or electric characteristics that fall outside the specified range, or quite fail to exhibit the functions, thereby causing production yields of semiconductor devices to decrease.

In manufacturing CMOS semiconductor devices, the semiconductor elements exhibit small threshold voltage Vth, large leakage current, and very poor electrical characteristics if they are formed on the semiconductor wafer having cross defects or circular defects formed by the phenomenon of thermal etching.

The object of the present invention is to provide a process for producing semiconductor devices, which prevents thermal etching from developing on the main surface of the semiconductor wafer so that the yield of semiconductor devices is not decreased by thermal etching.

Another object of the present invention is to provide a process for producing semiconductor devices having excellent electrical characteristics such as large threshold voltage and small leakage current, maintaining increased production yields, while preventing the occurrence of thermal etching at the time of forming a well diffusion layer in the semiconductor devices such as CMOS transistors and CMOS IC's.

The above and other objects as well as novel features of the present invention will become obvious from the description of the specification and the accompanying drawings.

A representative example of the invention disclosed in this application will be described below briefly.

Namely, a semiconductor wafer having a silicon dioxide ($SiO_2$) film formed on the main surface thereof is heat-treated at a high temperature in an inert gas atmosphere. In this case, oxygen is contained in small amounts in the inert gas, so that pinholes formed in the silicon dioxide film are buried therein by the action of oxygen. Accordingly, thermal etching is not induced by the inert gas of a high temperature, and the production yields of semiconductor devices can be increased.

The oxygen should be contained in an amount of about 200 ppm. If the oxygen is contained in amounts larger than the above amount, the silicon dioxide film will be formed thickly on the main surface of the semiconductor wafer, and an additional step will have to be provided to remove the silicon dioxide film by etching. Further, if the amount of oxygen is smaller than the above amount, it becomes difficult to reliably prevent the occurrence of thermal etching.

Further, the well diffusion layer is formed in CMOS construction by the heat-treatment at a high temperature in nitrogen which contains oxygen. This makes it possible to obtain semiconductor devices such as CMOS transistors and CMOS IC's having good electric characteristics maintaining increased yields, while preventing thermal etching on the surface where the well diffusion layer will be formed.

DESCRIPTION OF THE PREFERRED EMBODIMENTS

Figure 1:
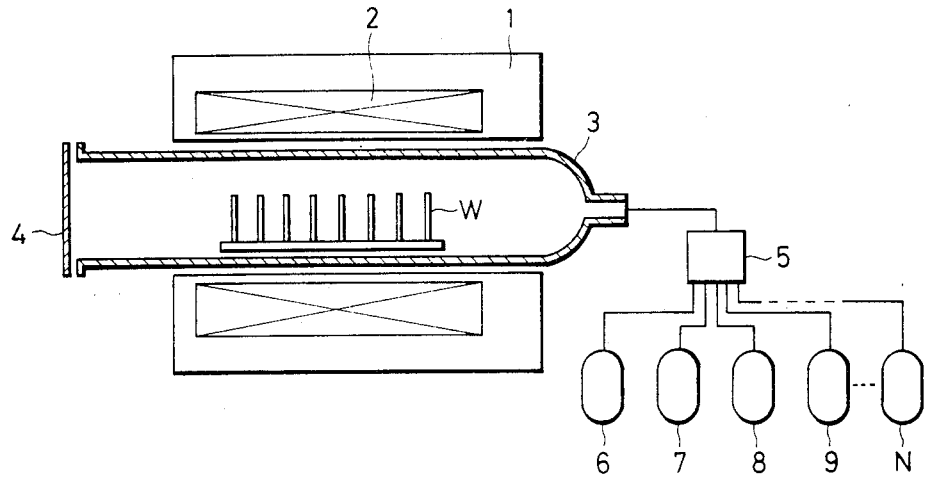
FIG. 1 is a diagram which schematically shows the construction of an apparatus for heat-treatment for putting the process of the present invention into practice.

FIG. 1 is a diagram which schematically shows the construction of an apparatus for heat-treatment for use in the present invention. FIG. 1 shows a lateral furnace in which a process tube 3 made of a quartz tube or the like is laterally provided in a furnace 1 equipped with heating means 2 such as an electric heater or the like. Semiconductor wafers W to be treated are arranged nearly in the center of the process tube 3, and a cap 4 is attached to the end of the side of a large diameter of the process tube 3 to shield the interior thereof from the exterior thereof. The end of the side of a small diameter of the process tube 3 is connected, via a gas controller 5, to a nitrogen source 6, an oxygen source 7, and other gas sources 8, - - - , N. By controlling the gas controller 5, gases of a predetermined mixing ratio can be introduced into the process tube 3.

Semiconductor wafers of a single crystal, e.g., monocrystalline silicon, into which impurity ions are implanted to form an impurity diffusion layer or, in other words, to form a pn junction, are set into the process tube 3, and the gas controller 5 is so controlled that the nitrogen containing about 200 ppm of oxygen is introduced into the process tube 3. Then, the interior of the process tube 3 is heated to 1200° C. by the furnace 1. The impurities are then thermally diffused in the semiconductor wafers W, and whereby the well diffusion layer is formed. At this point, the silicon dioxide ($SiO_2$) film will have been formed to a thickness of about 300 angstroms on the surface of the semiconductor wafers W, the silicon dioxide film often containing such defects as pinholes. Owing to the function of oxygen contained in the nitrogen, however, the defects are corrected, and the nitrogen does not directly affect the main surfaces of the wafers through the defects. Accordingly, thermal etching is prevented from taking place.

If the ratio of oxygen is smaller than the value mentioned above, thermal etching is not effectively prevented from occurring. If the oxygen ratio is larger than the above-mentioned value, on the other hand, the silicon substrate is oxidized. Therefore, the silicon dioxide film grows at an increased rate; i.e., the silicon dioxide film is formed thickly. Hence, the silicon dioxide film must be removed by etching at a subsequent step. When the oxygen is further used to form the well diffusion layer as deeply as, for example, 4 μm, the threshold voltage Vth is also affected by the ratio (concentration) of oxygen. Because of these reasons, the ratio of oxygen is limited with respect to the total gases. This ratio will be described later.

Figure 2:
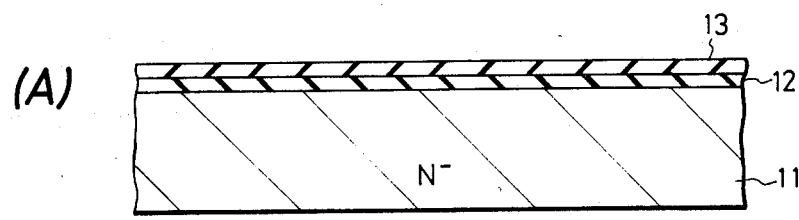
FIGS. 2(A) to 2(I) are diagrams of steps for producing a CMOS semiconductor device according to an embodiment of the present invention.
Figure 2:
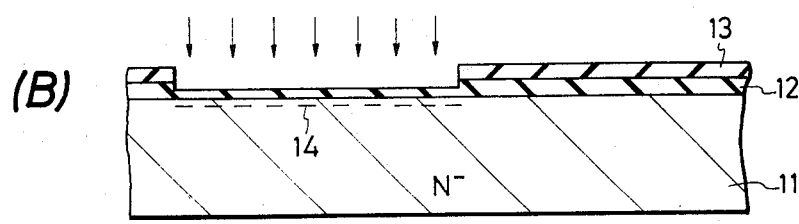
Figure 2:
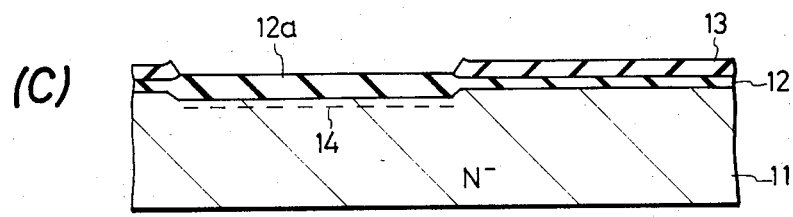
Figure 2:
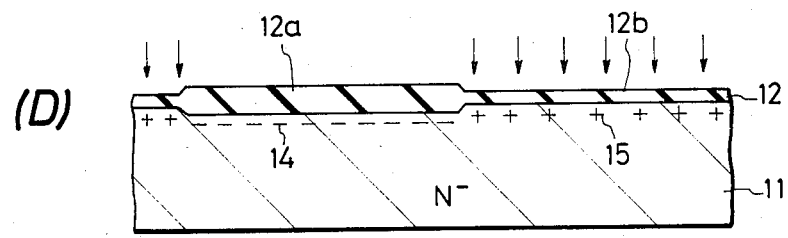
Figure 2:
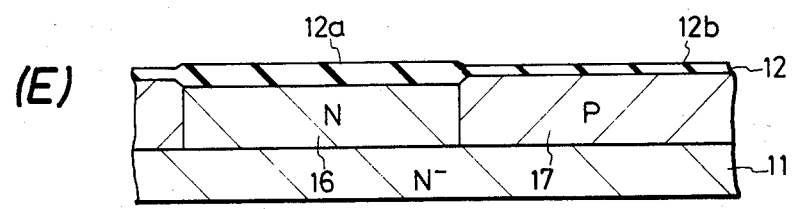
Figure 2:
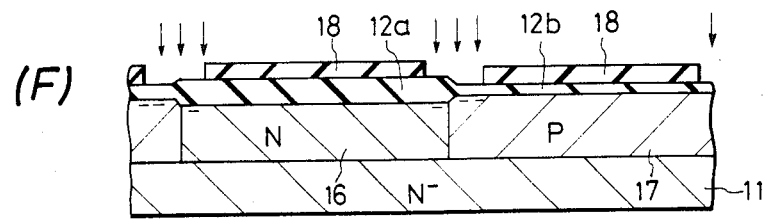
Figure 2:
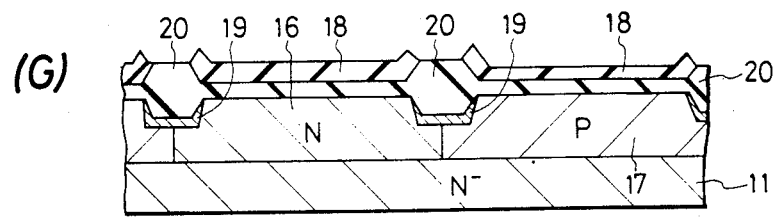
Figure 2:
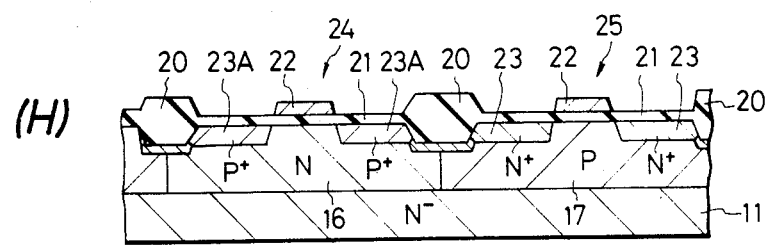
Figure 2:
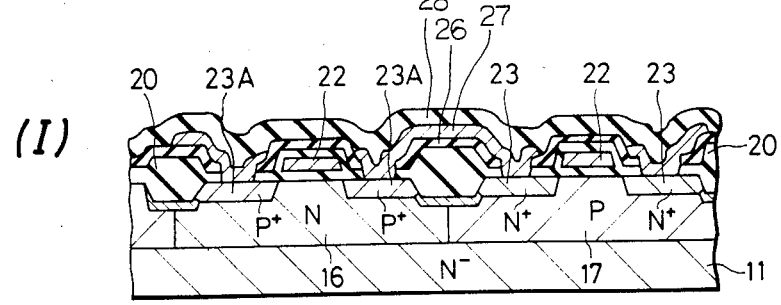
Figure 4:
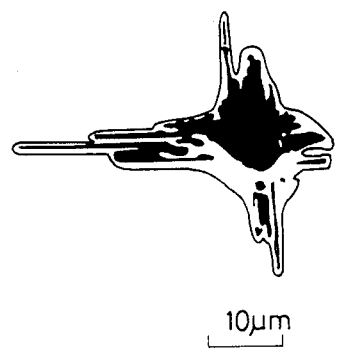
FIG. 4 is a plan view showing a cross defect formed on the silicon wafer by thermal etching.
Figure 5:
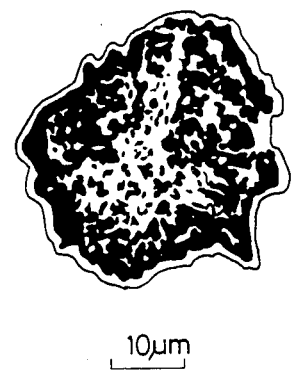
FIG. 5 is a plan view showing a circular defect formed on the silicon wafer by thermal etching.

FIG. 2 is a section view showing steps for producing a CMOS semiconductor device according to an embodiment of the present invention. The production steps of the invention will be concretely described below in conjunction with FIG. 2.

First, as shown in FIG. 2(A), a silicon dioxide ($SiO_2$) film 12 is formed by the thermal oxidation to a thickness of about 430 angstroms on the main surface of an n-type monocrystalline silicon wafer 11, and then a silicon nitride ($Si_3N_4$) film 13 is deposited thereon to a thickness of about 500 angstroms by the CVD method. Then a photoresist film is formed on the whole surface, and is then removed by developing from a portion where an n-type well diffusion layer will be formed. With the photoresist film as a mask, the silicon nitride film 13 is removed by etching as shown in FIG. 2(B). At this point, the silicon dioxide film 12 is also etched to a small degree. Then, with the silicon nitride film 13 as a mask, n-type impurities such as phosphorus ions are implanted to form an n-type ion-implanted layer 14 in the region where the n-type well diffusion layer is to be formed.

Then, the wafer 11 is placed in an oxidizing atmosphere to oxidize the surface thereof with the silicon nitride film 13 as a mask. A silicon dioxide ($SiO_2$) film 12a having a thickness of about 1350 angstroms is grown on the region of forming n-type well diffusion layer as shown in FIG. 2(C). The silicon nitride film 13 is then removed, and p-type impurities such as boron ions or boron difluoride ($BF_2$) ions are implanted into the wafer 11. Therefore, the slightly thick silicon dioxide film 12a works as a mask, and a p-type ion-implanted layer 15 is formed on the portion other than the region of forming the n-type well diffusion layer (or, in other words, formed in the region where the p-type well diffusion layer is to be formed) as shown in FIG. 2(D).

The silicon wafer 11 is set into the heat-treating apparatus shown in FIG. 1, and is heat-treated at 1200° C. in nitrogen atmosphere containing about 200 ppm of oxygen. Therefore, the n-type ion-implanted layer 14 and the p-type ion-implanted layer 15 are activated, and the n-type impurities and p-type impurities are diffused in the wafer 11, thereby to form an n-type well diffusion layer 16 and a p-type well diffusion layer 17 as shown in FIG. 2(E). In the region of forming the p-type well diffusion layer, at this point, there exists only the silicon dioxide film 12b having a thickness of about 340 angstroms (thickness is reduced from 430 angstroms to 340 angstroms since the silicon dioxide layer is slightly etched at the time of removing the silicon nitride film 13) on the surface of the wafer. Though the silicon dioxide film contains defects such as pinholes to some extent, oxygen contained in the nitrogen gas so acts that silicon dioxide is formed in the defects; i.e., defects are corrected. The reason is presumed to be that the silicon dioxide film grows again, so as to bury the pinholes. Therefore, thermal etching does not develop on the surface of the p-type well diffusion layer 17.

After the n-type well diffusion layer 16 and the p-type well diffusion layer 17 are formed as described above, a silicon nitride film 18 is selectively formed by photoetching as shown in FIG. 2(F). Using the silicon nitride film 18 as a mask, impurities for forming a channel stopper are implanted by the ion injection method, followed by selective oxidation, thereby to form a channel stopper 19 and a field silicon dioxide film 20 having a large thickness between the two well diffusion layers 16 and 17 as shown in FIG. 2(G). Then, the silicon dioxide films 12a, 12b are removed from the two well diffusion layers 16, 17, and thin silicon dioxide films 21, 21 that serve as gate insulating films are newly formed. Thereafter, gate electrodes 22, 22 and diffusion layers 23, 23A that serve as source layers or drain layers, are formed in the usual manner. Thus, a p-channel MOS transistor 24 is formed in the region of n-type well diffusion layer 16, and an n-channel MOS transistor 25 is formed in the region of p-type well diffusion layer 17 as shown in FIG. 2(H), thereby to constitute a semiconductor device of the CMOS construction as shown in FIG. 2(I).

In FIG. 2(I), reference numeral 26 denotes a PSG film, 27 denotes an aluminum wiring layer, and 28 denotes a passivation insulating film.

The gate threshold voltage Vth of the thus constructed MOS transistor and particularly, of the n-channel MOS transistor 25 formed on the p-type well diffusion layer 17, was measured while changing the oxygen concentration in the nitrogen gas at the time of forming the p-type well diffusion layer 17 by diffusion. The results obtained were as shown in FIG. 3(A), wherein the abscissa represents the concentration of oxygen gas (ppm) in the nitrogen gas, and the ordinate represents deviation from a reference threshold voltage Vth.

That is, the threshold voltage Vth increases with the increase of oxygen in the nitrogen at the time of forming the p-type well diffusion layer 17. Therefore, if the upper and lower limits of threshold voltage Vth are set, the range of oxygen gas can be defined. In the case of this embodiment, it will be understood from the drawings that the oxygen concentration in the nitrogen gas should range from about 100 to about 500 ppm.

Figure 3:
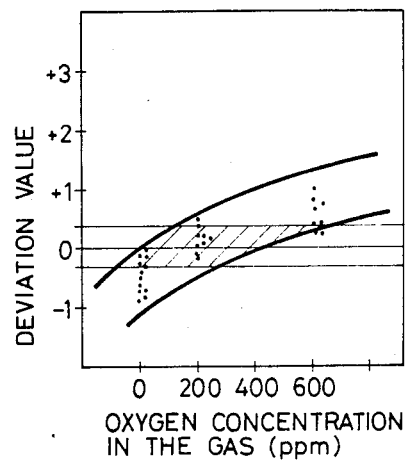
FIGS. 3(A) and 3(B) are diagrams showing correlations between the oxygen concentration in nitrogen and the threshold voltage Vth.
Figure 3:
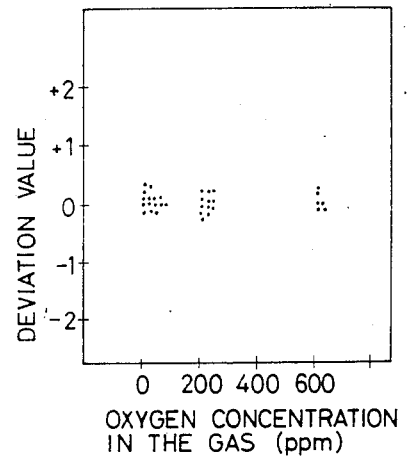

The gate threshold voltage Vth of the p-channel MOS transistor 24 on the n-type well diffusion layer 16 is as shown in FIG. 3(B). In this case, the threshold voltage has no correlation to the concentration of oxygen gas. This is due to the fact that there exists the silicon dioxide film 12a having a thickness of about 1350 angstroms on the region for forming the n-type well diffusion layer, which is different from the case where there exists the silicon dioxide film 12b having a thickness of as small as about 340 angstroms on the region for forming the p-type well diffusion layer. Namely, there exists no correlation between the threshold voltage and the concentration of oxygen, and thermal etching does not take place.

In producing the CMOS semiconductor device of the present invention, thermal etching develops very little, and the yield is not decreased by the thermal etching.

In the process of producing CMOS IC's according to another embodiment of the present invention, the silicon wafer having a silicon dioxide film of a thickness of smaller than 1000 angstroms formed on the surface thereof is heat-treated at 1200° C. for 180 to 360 minutes in nitrogen atmosphere containing less than 1% by volume of oxygen in order to form a well diffusion layer which is 3 μm to 4.5 μm deep. In this case, thermal etching does not take place, and defective semiconductor elements are not formed.

When there exists a silicon dioxide film having a thickness of greater than about 1000 angstroms, it is quite difficult to add impurities, by the ion injection method, to the semiconductor wafer under the silicon oxide film.

It was found that if the thickness of the silicon dioxide film is smaller than about 1000 angstroms, the semiconductor wafer becomes defective due to the presence of pinholes, i.e., due to thermal etching, though it may vary depending upon the conditions for forming the film and the process for producing the semiconductor wafers.

In the CMOS IC, the well diffusion layer is formed by thermally diffusing the impurity ions to have a thickness of 3 μm, 4 μm or 5 μm. To form the well diffusion layer to a depth of 3 μm, heat-treatment must be effected at 1200° C. and for 180 minutes. To form the well diffusion layer to a depth of 4.5 μm, heat-treatment must be effected at 1200° C. for 360 minutes. According to the present invention, the feature resides in that the oxygen is contained in the atmosphere such as inert nitrogen in which the heat-treatment is effected at a high temperature for an extended period of time, such that thermal etching caused by the inert gas is effectively prevented.

The present invention can be adapted particularly effectively to the process for producing semiconductor devices of the CMOS construction or CMIS construction. The present invention can be adapted to a variety of devices such as bipolar CMOS semiconductor devices in which the CMOS IC, CMOS LSI, CMIS IC, CMIS LSI, bipolar semiconductor elements and CMOS semiconductor elements are formed on the same semiconductor substrate. The invention can further be adapted to a process for producing such devices.

Effects of the present invention are summarized below.

(1) The impurities are diffused in nitrogen atmosphere containing oxygen gas at a high temperature in order to form a well diffusion layer 3 μm to 5 μm in the silicon wafer of which the surface is covered with a silicon dioxide film having a thickness of 1000 angstroms or less. Therefore, thermal etching does not take place on the surface of the wafer, and the yield is not reduced by thermal etching.

(2) In forming a well diffusion layer having a deep junction region required for a semiconductor device of the CMOS construction, the impurities are diffused in the nitrogen atmosphere containing oxygen as mentioned above. Therefore, thermal etching is prevented from taking place in the process for forming the well diffusion layer, and the MOS transistor formed in the eegion of well diffusion layer exhibits stable characteristics.

(3) The oxygen is contained at 200 ppm (100 to 500 ppm) in the nitrogen gas. This makes it possible to confine the threshold voltage Vth and leakage current of the MOS transistor formed in the region of well diffusion layer within desired ranges, presenting advantage from the standpoint of designing the MOS transistors.

In the foregoing was concretely described the invention accomplished by the inventors by way of an embodiment. However, the invention should in no way be limited to the above-mentioned embodiment only, but may be modified in a variety of other ways without departing from the spirit and scope of the invention. For example, the impurities may be diffused to form the well diffusion layer under the condition where a thin silicon dioxide film is formed on the surface of the n-type well diffusion layer or under the condition where a thin silicon dioxide film is formed on the p-type and n-type well diffusion layers.

Although the foregoing description has mainly dealt with the case where the invention accomplished by the inventors was adapted to the art for forming the well diffusion layer in a semiconductor device of the CMOS construction in the field of art that served as the background of the invention, it should be noted that the invention is not limited thereto only but can be adapted to the art in general to treat the semiconductor wafers having, on the surface thereof, a silicon dioxide film having a thickness of smaller than about 1000 angstroms, in an inert gas atmosphere at a high temperature.

What is claimed is:

1. In a process for producing semiconductor devices by treating a semiconductor substrate having a silicon dioxide film on the surface thereof in an inert gas atmosphere at a high temperature, the improvement wherein oxygen is contained in an amount of 100 ppm to 500 ppm in said inert gas, said amount of oxygen being such that thermal etching of the semiconductor substrate during the high temperature treatment is prevented without formation of a thick oxide film on the semiconductor substrate.

2. A process for producing semiconductor devices according to claim 1, wherein said inert gas is composed of nitrogen, and the oxygen gas is contained at a concentration of about 200 ppm.

3. A process for producing semiconductor devices according to claim 1, wherein impurities implanted into the semiconductor substrate by the ion injection method are diffused at said high temperature.

4. A process for producing semiconductor devices according to claim 1, wherein the semiconductor substrate is a semiconductor wafer.

5. A process for producing semiconductor devices according to claim 1, wherein the semiconductor substrate is a single crystal semiconductor material.

6. A process for producing semiconductor devices according to claim 1, wherein the semiconductor substrate is monocrystalline silicon.

7. A process for producing semiconductor devices according to claim 1, wherein said silicon dioxide film has a thickness of less than 1000 angstroms.

8. A process for producing semiconductor devices according to claim 7, wherein said semiconductor substrate is monocrystalline silicon.

9. A process for producing semiconductor devices according to claim 8, wherein said high temperature is a temperature of around 1200° C.

10. A process for producing semiconductor devices according to claim 1, wherein said semiconductor substrate contains impurities in a surface region thereof, and said high temperature is a temperature sufficiently high to cause diffusion of said impurities into the semiconductor substrate.

11. A process for producing semiconductor devices according to claim 10, wherein said silicon dioxide film has a thickness of less than 1000 angstroms.

12. A process for producing semiconductor devices according to claim 11, wherein said semiconductor substrate is monocrystalline silicon.

13. A process for producing semiconductor devices according to claim 12, wherein said high temperature is a temperature of around 1200° C.

14. In a process for producing CMOS semiconductor devices by treating a semiconductor substrate which has a silicon dioxide film formed on the surface thereof and into which impurities are implanted by ion injection, in an inert gas atmosphere at a high temperature, and diffusing said impurities to form a well diffusion layer, thereby to form p-channel and n-channel MOS transistors on the well diffusion layer and on the semiconductor substrate, the improvement wherein oxygen is contained in said inert gas in an amount of 100 ppm to 500 ppm, the amount of oxygen being such that thermal etching of the semiconductor substrate during the high temperature treatment is prevented, without formation of a thick oxide film on the semiconductor substrate.

15. A process for producing semiconductor devices according to claim 14, wherein said inert gas is composed of nitrogen, and oxygen is contained at a concentration of about 200 ppm.

16. A process for producing semiconductor devices according to claim 14, wherein the silicon dioxide film is formed on the surface of a silicon wafer, impurities are implanted into the silicon wafer by ion injecting, and said impurities are diffused into the wafer in a nitrogen atmosphere containing oxygen in an amount of 100 ppm to 500 ppm at 1200° C., thereby to form a well diffusion layer.

17. A process for producing semiconductor devices according to claim 14, wherein the semiconductor substrate is a semiconductor wafer.

18. A process for producing semiconductor devices according to claim 14, wherein the semiconductor substrate is a single crystal semiconductor material.

19. A process for producing semiconductor devices according to claim 14, wherein the semiconductor substrate is monocrystalline silicon.

20. A process for producing semiconductor devices according to claim 14, wherein said silicon dioxide film has a thickness of less than 1000 angstroms.

21. A process for producing semiconductor devices according to claim 20, wherein said semiconductor substrate is monocrystalline silicon.

* * * * *